(12) United States Patent
Fukuda

(10) Patent No.: US 8,189,401 B2
(45) Date of Patent: May 29, 2012

(54) SEMICONDUCTOR MEMORY DEVICE AND CONTROL METHOD OF THE SAME

(75) Inventor: Yasuyuki Fukuda, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 260 days.

(21) Appl. No.: 12/724,882

(22) Filed: Mar. 16, 2010

(65) Prior Publication Data

US 2010/0238724 A1 Sep. 23, 2010

(30) Foreign Application Priority Data

Mar. 17, 2009 (JP) .................. 2009-064983

(51) Int. Cl.
*G11C 7/10* (2006.01)
*G11C 16/04* (2006.01)
*G11C 16/06* (2006.01)

(52) U.S. Cl. ......... 365/189.05; 365/185.02; 365/185.09; 365/185.17; 365/185.21

(58) Field of Classification Search .............. 365/189.05
See application file for complete search history.

(56) References Cited

U.S. PATENT DOCUMENTS

| | | | | |
|---|---|---|---|---|
| 7,215,575 | B2* | 5/2007 | Chen et al. | 365/185.22 |
| 7,532,520 | B2* | 5/2009 | Yanagidaira et al. | 365/185.29 |
| 7,911,864 | B2* | 3/2011 | Itoh | 365/211 |
| 7,916,547 | B2* | 3/2011 | Hosono | 365/185.21 |
| 2005/0162913 | A1* | 7/2005 | Chen | 365/185.18 |
| 2010/0329014 | A1* | 12/2010 | Lim et al. | 365/185.18 |
| 2011/0063915 | A1* | 3/2011 | Tanaka et al. | 365/185.17 |
| 2012/0008385 | A1* | 1/2012 | Yoo et al. | 365/185.2 |
| 2012/0008425 | A1* | 1/2012 | Park | 365/189.05 |

FOREIGN PATENT DOCUMENTS

JP 2003-60093 2/2003

* cited by examiner

*Primary Examiner* — Son Mai
(74) *Attorney, Agent, or Firm* — Oblon, Spivak, McClelland, Maier & Neustadt, L.L.P.

(57) ABSTRACT

A semiconductor memory device includes a memory cell array including a plurality of memory cells, a first data latch circuit, a second data latch circuit, an arithmetic circuit, a counter circuit, and a controller. And controller compares the number (N) counted by the counter circuit with a reference number (M), and performs control to output flag information outside if $N \geq M$.

19 Claims, 11 Drawing Sheets

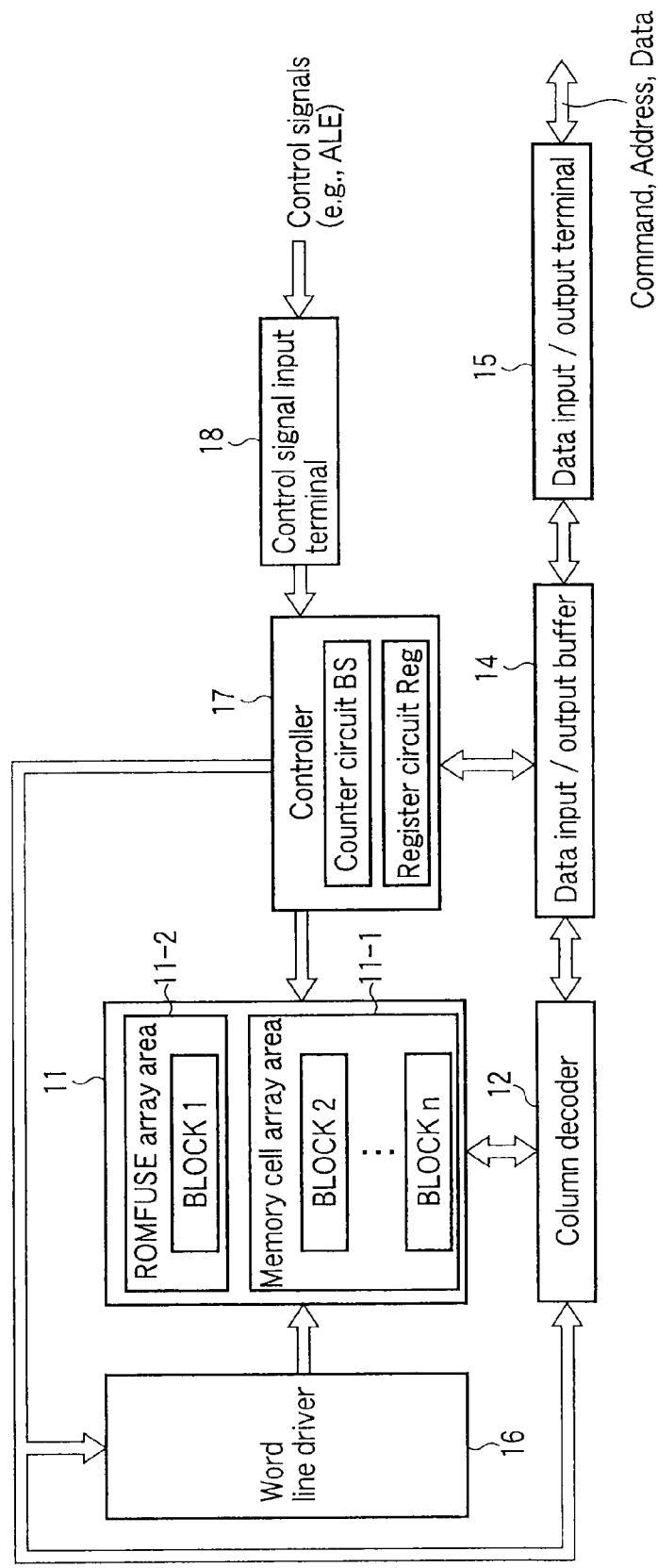
F I G. 1

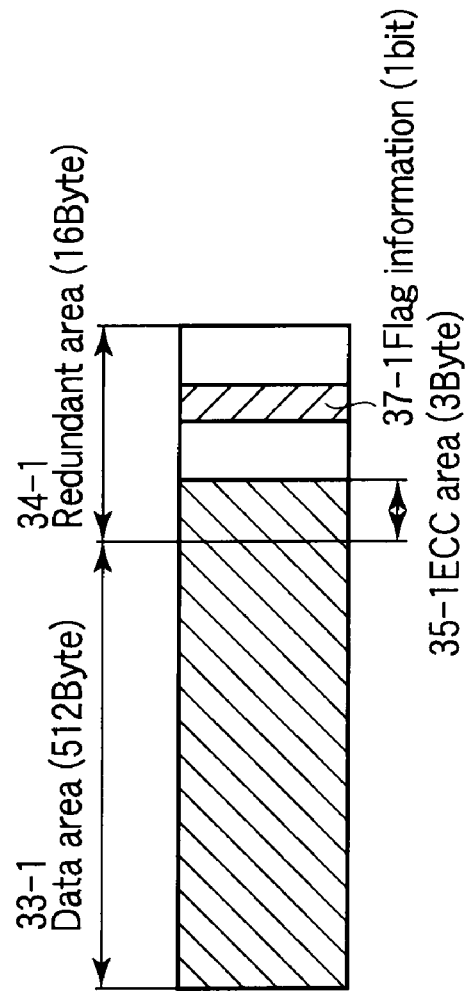
F I G. 8

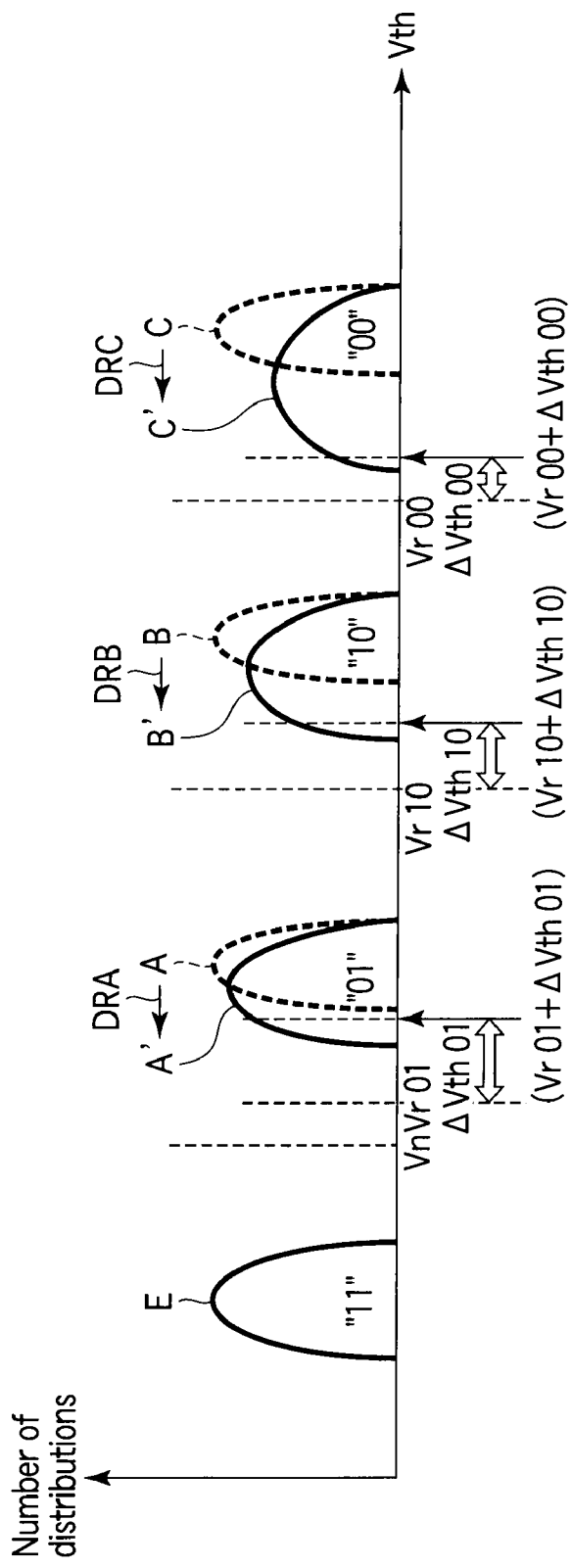
F I G. 10

SEMICONDUCTOR MEMORY DEVICE AND CONTROL METHOD OF THE SAME

CROSS-REFERENCE TO RELATED APPLICATIONS

This application is based upon and claims the benefit of priority from prior Japanese Patent Application No. 2009-064983, filed Mar. 17, 2009, the entire contents of which are incorporated herein by reference.

BACKGROUND OF THE INVENTION

1. Field of the Invention

The present invention relates to a semiconductor memory device and a control method of the same, and is applied to, e.g., a NAND flash memory.

2. Description of the Related Art

A NAND flash memory as an example of a semiconductor memory device includes a series circuit of a plurality of memory cells as a basic unit (NAND unit). The NAND unit has one end connected to a bit line via a select gate (SGD), and the other end connected to a source line via another select gate (SGS).

Data read and write operations are performed for each unit called a page connected to one word line. A set of pages sandwiched between the select gate (SGD) on the bit line side and the select gate (SGS) on the source line side forms a block.

Data is stored in the NAND flash memory by injecting electrons into or releasing electrons from a floating gate, thereby fluctuating the threshold value of a memory cell. The floating gate is insulated as it is surrounded by, e.g., an intergate insulating film as an insulating film. Therefore, even when the power supply is turned off after electrical injection or release, electrons are held in the floating gate in a nonvolatile manner.

BRIEF SUMMARY OF THE INVENTION

A semiconductor memory device according to an aspect of the present invention comprising: a memory cell array including a plurality of memory cells arranged at intersections of a plurality of word lines and a plurality of bit lines; a first data latch circuit which latches first readout data read out from the memory cell by using a parameter of an actual read level; a second data latch circuit which latches second readout data read out from the memory cell by using a parameter of a level shifted to be higher than the actual read level; an arithmetic circuit which performs an arithmetic operation on the first readout data and the second readout data; a counter circuit which counts the number (N) of differences between the first readout data and the second readout data in an operation result from the arithmetic circuit; and a controller which compares the number (N) with a reference number (M), and performs control to output flag information outside if $N \geq M$.

A semiconductor memory device control method according to an aspect of the present invention comprising: acquiring first readout data by reading out the data from a memory cell at an actual read level; acquiring second readout data by reading out the data from the memory cell at a level shifted to be higher than the actual read level; performing an arithmetic operation on the first readout data and the second readout data; counting the number (N) of differences between the first readout data and the second readout data in an operation result; and comparing the number (N) with a reference number (M), and outputting flag information outside if $N \geq M$.

BRIEF DESCRIPTION OF THE SEVERAL VIEWS OF THE DRAWING

FIG. 1 is a system block diagram showing an example of the overall configuration of a semiconductor memory device of the present invention;

FIG. 8 is a view showing a unit memory area (page) of the semiconductor memory device according to a step (ST6) shown in FIG. 5;

FIG. 10 is a graph showing threshold distributions for explaining a data refresh control operation of the semiconductor memory device according to the second embodiment.

DETAILED DESCRIPTION OF THE INVENTION

Figure 2:
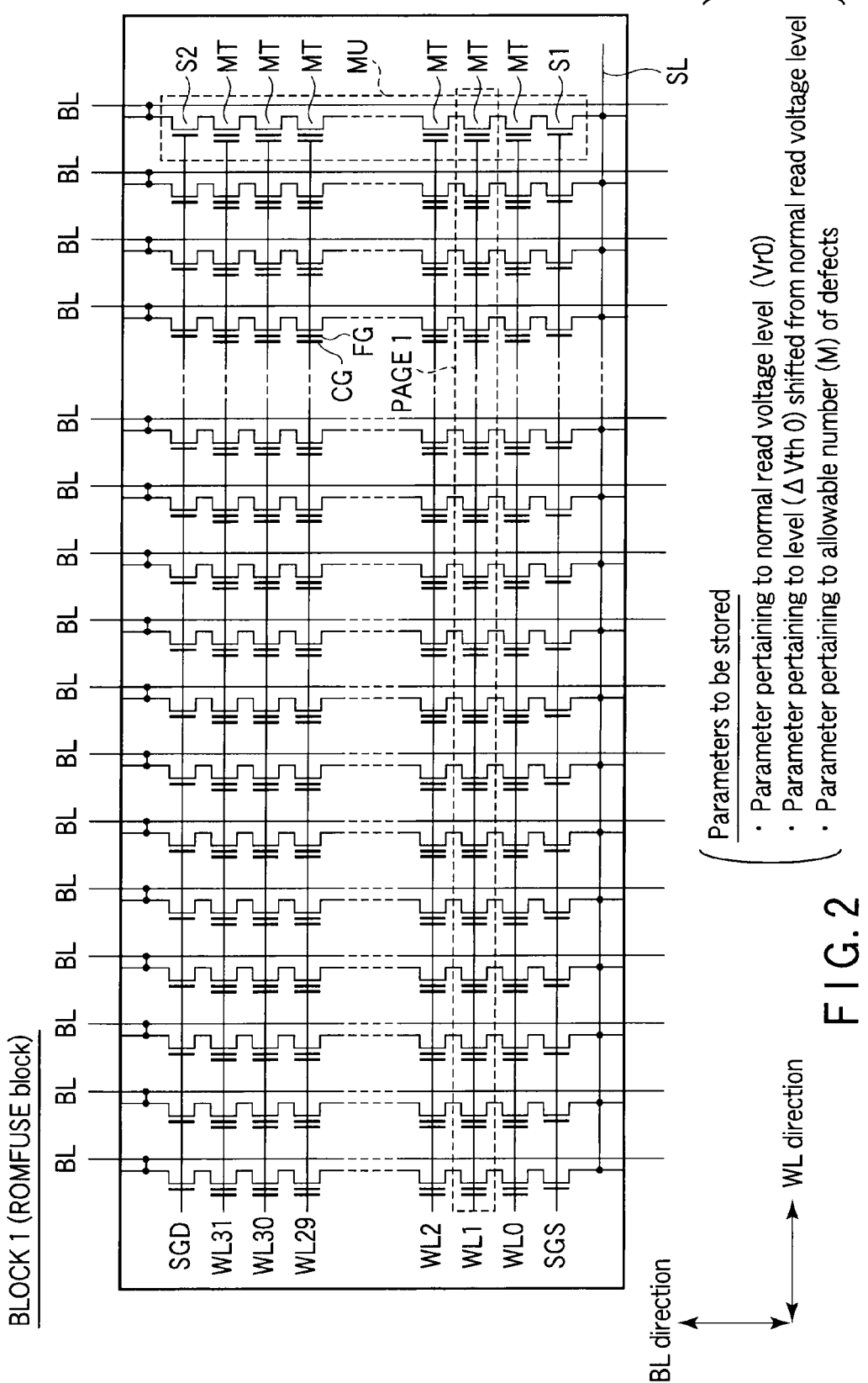
FIG. 2 is an equivalent circuit diagram showing a block (ROMFUSE block) shown in FIG. 1.

Recently, data retention often destroys data in a semiconductor memory device (see, e.g., Jpn. Pat. Appln. KOKAI Publication No. 2003-60093). "Data retention" is a phenomenon in which when a memory cell is returning to a stabler state, electrons injected into a floating gate leak out or new electrons enter the floating gate, thereby fluctuating the threshold value of the memory cell.

Embodiments of the present invention will be explained below with reference to the accompanying drawing. Note that in the following explanation, the same reference numerals denote the same parts throughout the drawing. The explanation will be made by taking a NAND flash memory as an example of a semiconductor memory device.

First Embodiment

Example of Binary Memory Cell (SLC)

A semiconductor memory device and a control method of the same according to the first embodiment of the present invention will be explained below with reference to FIGS. 1 to 8. This embodiment is directed to a binary memory cell (SLC: Single Level Cell) capable of storing one-bit data in one memory cell.

1. Configuration Example

1-1. Overall Configuration Example

First, an example of the overall configuration of a NAND flash memory according to the first embodiment will be explained with reference to FIG. 1.

As shown in FIG. 1, the NAND flash memory according to this embodiment includes a memory cell array 11, column decoder 12, data input/output buffer 14, data input/output terminal 15, word line driver 16, controller 17, and control signal input terminal 18.

The memory cell array 11 is divided into a memory cell array area 11-1 and ROMFUSE array area 11-2, and includes a plurality of blocks (BLOCK 1 to BLOCK n). Each of the plurality of blocks (BLOCK 1 to BLOCK n) includes a plurality of memory cells arranged in a matrix at the intersections of a plurality of word lines and a plurality of bit lines. The memory cell array 11 is electrically connected to the word line driver 16 for controlling the word lines, the column decoder 12 for controlling the bit lines, and the controller 17.

The memory cell array area 11-1 of this example includes a plurality of blocks (BLOCK 2 to BLOCK n), and is used to write, read out, and erase general data such as user data.

The ROMFUSE array area 11-2 of this example includes a ROMFUSE block (BLOCK 1). The ROMFUSE block records information for optimizing the initial circuit settings of the fabricated NAND flash memory chip in accordance with the variations in circuit operations caused by the fabrication conditions of the chip, and replacing a defective column or block with a good column or block (redundancy), parameters pertaining to a read level (Vr0), and the like. The information, parameters, and the like are read out from the ROMFUSE block when the power supply is turned on, loaded into a register circuit Reg of the controller 17, and used to optimize the operation of the NAND flash memory. This will be explained in more detail later in the explanation of a data refresh control operation.

The column decoder 12 reads out data from a memory cell in the memory cell array 11 via a bit line, and detects the state of the memory cell in the memory cell array 11 via the bit line. Also, the column decoder 12 writes data in a memory cell of the memory cell array 11 by applying a write control voltage to the memory cell via a bit line under the control of the controller 17. The column decoder 12 is connected to the data input/output buffer 14. The arrangement of the column decoder 12 will be described later.

Memory cell data selected and read out by the column decoder 12 is output outside from the data input/output terminal 15 via the data input/output buffer 14. The data input/output terminal 15 is connected to, e.g., an external memory controller or host apparatus.

The host apparatus is, e.g., a micro computer, and receives readout data output from the data input/output terminal 15. In addition, the host apparatus outputs various commands (Command) for controlling the operation of the NAND flash memory, addresses (Address), and write data (Data). The write data input from the host apparatus to the data input/output terminal 15 is supplied to a selected data storage circuit (not shown) in the column decoder 12 via the data input/output buffer 14. The various commands (Command) and addresses (Address) are supplied to the controller 17.

The word line driver 16 selects a word line in the memory cell array 11, and applies a voltage necessary for data read, write, or erase to the selected word line.

The controller 17 includes the register circuit Reg and a counter circuit BS, and applies necessary control signals and control voltages to electrically connected circuits. The controller 17 is electrically connected to the memory cell array 11, column decoder 12, data input/output buffer 14, and word line driver 16, and controls the connected circuits. The controller 17 is connected to the control signal input terminal 18, and controlled by control signals such as an ALE (Address Latch Enable) signal input from the host apparatus via the control signal input terminal 18. Also, the controller 17 includes an internal voltage generator, and supplies control voltages necessary for the operations of the connected circuits described above.

As will be described later, the register circuit Reg stores, e.g., redundancy information pertaining to parameters read out from the ROMFUSE block (BLOCK 1) when the power supply is turned on in the data refresh operation.

The counter circuit (bit scan circuit) BS counts, e.g., the number of data "0" (the number of differences between first readout data and second readout data) (N) of data stored in a third data latch circuit DL3, in one step (ST5) of the data refresh control operation (to be described later).

The column decoder 12, data input/output buffer 14, word line driver 16, and controller 17 form a write circuit, read circuit, and erase circuit.

1-2. Configuration Example of Block (BLOCK 1)

An example of the configuration of the block (BLOCK) forming the memory cell array 11 according to the first embodiment will be explained below with reference to FIG. 2. In the following explanation, one block (BLOCK 1 (ROMFUSE block)) shown in FIG. 1 will be taken as an example. Data in memory cells in the block BLOCK 1 are collectively erased. Therefore, the block is an erase unit.

The block BLOCK 1 includes a plurality of memory cell units MU juxtaposed in the word line direction (WL direction). The memory cell units MU each include a NAND string (memory cell string) including 32 memory cells MT aligned in the bit line direction (BL direction) perpendicular to the word line direction and having series-connected current paths, a source-side selection transistor S1 connected to one end of the current path of the NAND string, and a drain-side selection transistor S2 connected to the other end of the current path of the NAND string.

The memory cell (memory cell transistor) MT has a multilayered structure formed by sequentially stacking a gate insulating film, floating gate FG (charge storage layer), intergate insulating film, and control gate CG on a semiconductor substrate.

The other end of the current path of the source-side selection transistor S1 is connected to a source line SL. The other end of the current path of the drain-side selection transistor S2 is connected to one of a plurality of bit lines BL, which corresponds to the memory cell unit MU.

Word lines WL0 to WL31 run in the WL direction, and are connected together to the control gate electrodes CG of a plurality of memory cells in the WL direction. A selection gate line SGS runs in the WL direction, and is connected to a plurality of selection transistors S1 in the WL direction. A selection gate line SGD runs in the WL direction, and is connected to a plurality of selection transistors S2 in the WL direction.

A page (PAGE) exists for each of the word lines WL0 to WL32. For example, a page (PAGE 1) exists for the word line WL1, as indicated by broken lines in FIG. 2. Since read and write operations are performed page by page, the page is a read unit and write unit.

As described previously, the page of BLOCK 1 (ROM-FUSE block) according to this example functions as a memory circuit for recording the information (redundancy information) concerning redundancy for optimizing the initial circuit settings of the fabricated flash memory chip in accordance with the variations in circuit operations caused by the fabrication conditions of the chip, and replacing a defective column or block with a good column or block. When the power supply is turned on for the data refresh control operation (to be described later), the redundancy information is read out from the ROMFUSE block, loaded into the register circuit Reg of the controller 17, and used to optimize the operation of the flash memory chip.

For example, redundancy information pertaining to parameters to be stored in one of the pages in this ROMFUSE block is as follows. In addition, the following parameters can be changed for each chip (each NAND flash memory 10), each block, and each page.

Normal read voltage level: $Vr0$
Shift value from normal read level: $\Delta Vth0$
Number of allowable defects (reference number): M Note that the NAND string includes the 32 memory cells MT in this embodiment, but the NAND string need only include two or more memory cells, e.g., 8 or 16 memory cells, so the number is not particularly limited to 32.

1-3. Configuration Example of Column Decoder

An example of the configuration of the column decoder according to this embodiment will be explained below with reference to FIG. 3.

Figure 3:
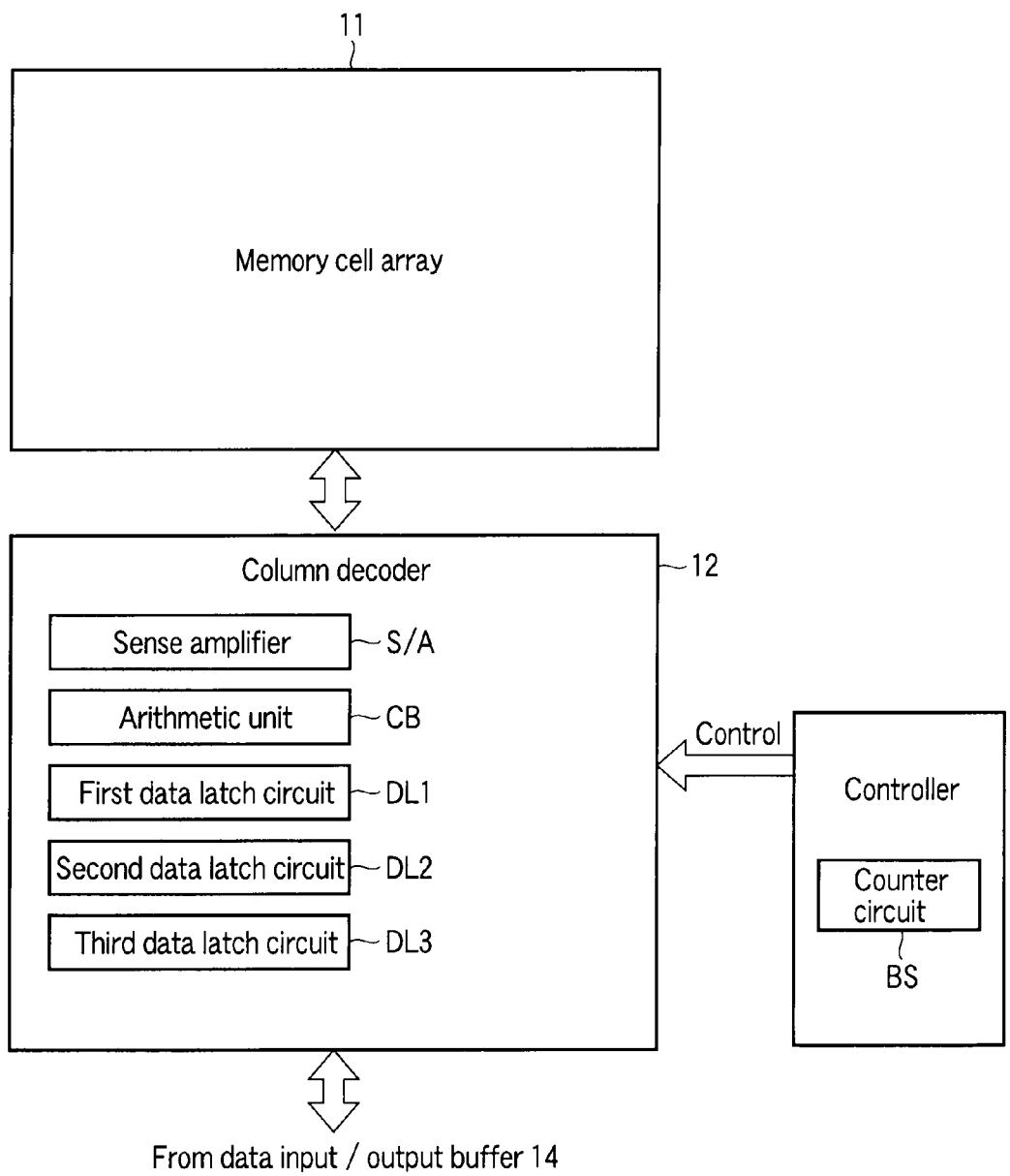
FIG. 3 is a block diagram for explaining an example of the arrangement of a column decoder according to the first embodiment.

As shown in FIG. 3, the column decoder 12 according to this embodiment includes a sense amplifier S/A, an arithmetic unit CB, and first to third data latch circuits DL1 to DL3. Note that in this example, the sense amplifier S/A, arithmetic unit CB, and first to third data latch circuits DL1 to DL3 exist for each bit line BL. Accordingly, the three data latch circuits DL1 to DL3 exist for each bit line BL.

The sense amplifier S/A amplifies data of the memory cell MT and reads out the amplified data.

The arithmetic unit CB calculates the exclusive OR (XOR) of data stored in the first data latch circuit DL1 and data stored in the second data latch circuit DL2, in the data refresh control operation (to be described later).

The first data latch circuit DL1 stores page data (first readout data) in one step (ST1) of the data refresh control operation.

The second data latch circuit DL2 stores page data (second readout data) in one step (ST2) of the data refresh control operation.

The third data latch circuit DL3 stores the operation result from the arithmetic unit CB in one step (ST4) of the data refresh control operation. Note that the third data latch circuit DL3 is not always necessary in the data refresh control operation.

1-4. Threshold Distribution Example (SLC)

Figure 4:
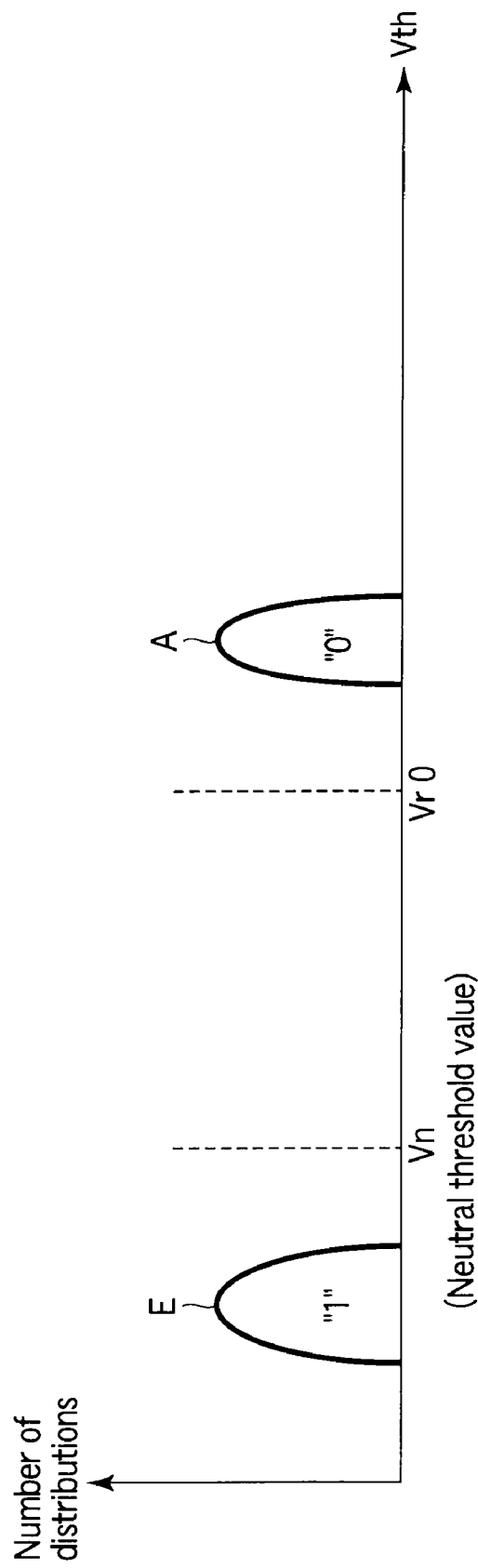
FIG. 4 is a graph showing the threshold distributions (binary) of a semiconductor memory device according to the first embodiment.
Figure 5:
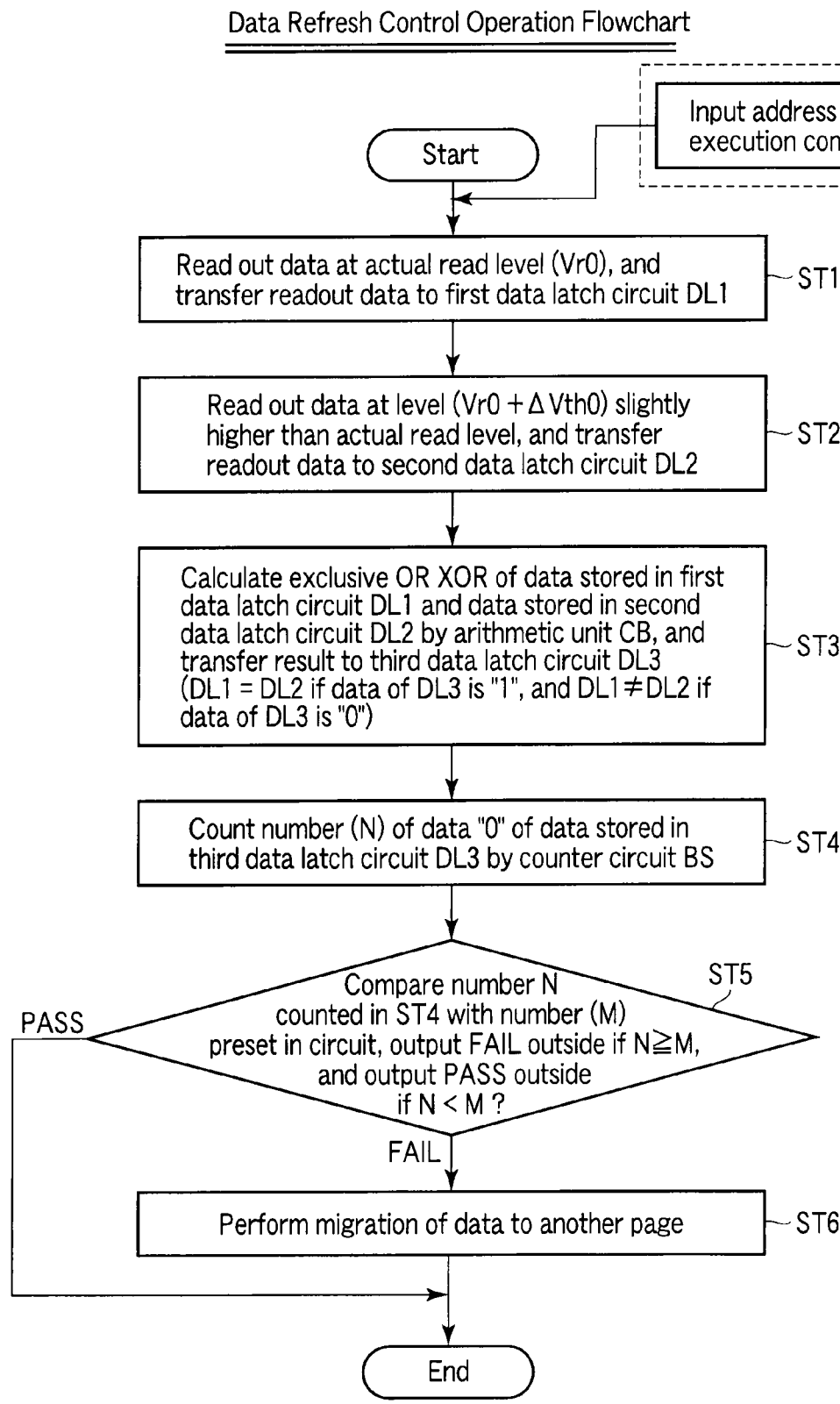
FIG. 5 is a flowchart showing a data refresh control operation of the semiconductor memory device according to the first embodiment.

A threshold distribution example (SLC) according to this embodiment will be explained below with reference to FIG. 4. As shown in FIG. 4, this example is a binary memory cell (SLC) capable of storing one-bit data in one memory cell (MT). Therefore, two threshold distributions, i.e., a state "1(E)" and state "0(A)" exist. Also, a read voltage $Vr0$ for reading out the state "0(A)" is set between a neutral threshold voltage $Vn$ and the state "0(A)".

2. Data Refresh Control Operation

Figure 6:
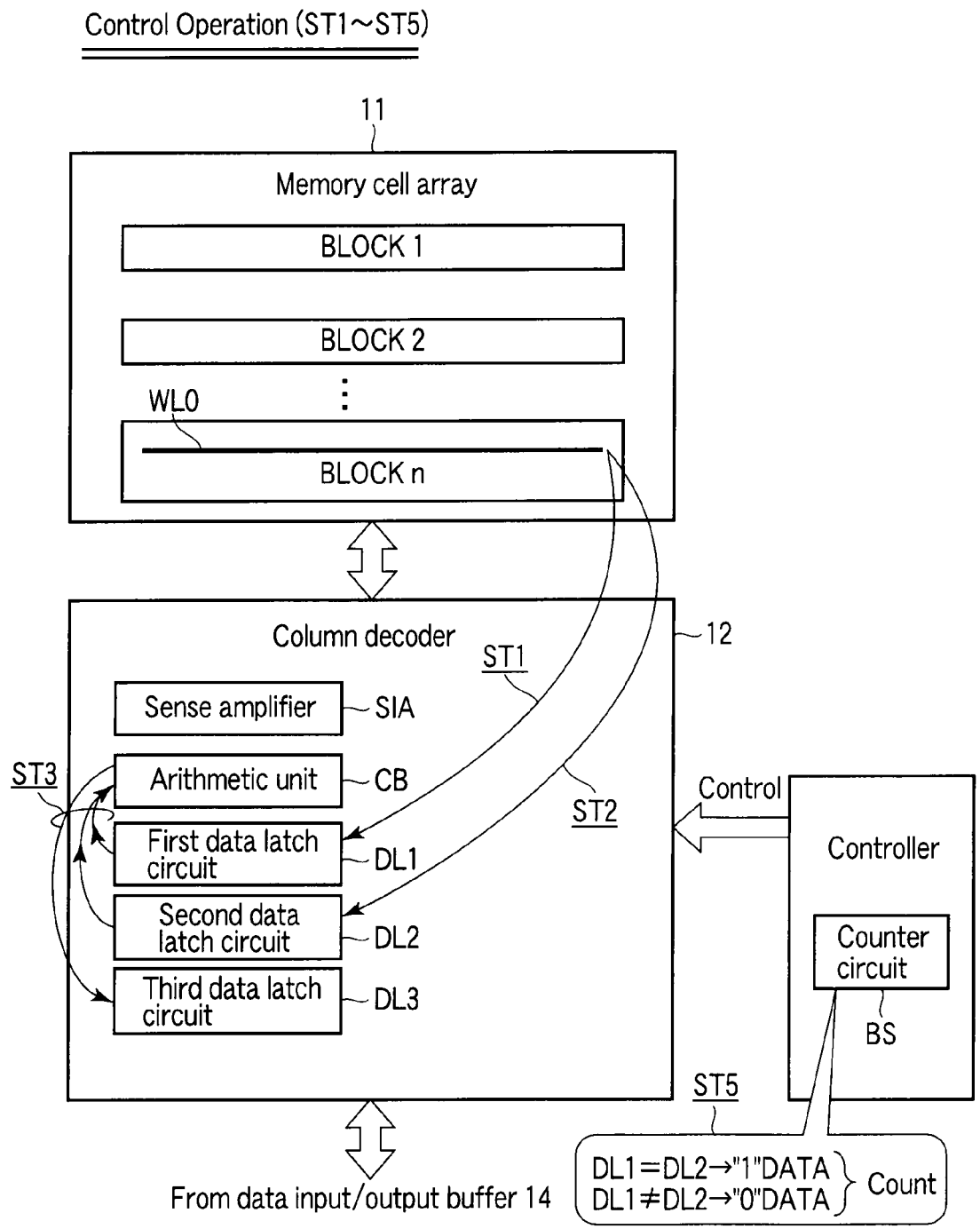
FIG. 6 is a block diagram for explaining steps (ST1 to ST5) shown in FIG. 5.

The data refresh control operation according to this embodiment will now be explained with reference to FIGS. 5 to 8. The explanation will be made following a flowchart shown in FIG. 5. Also, as shown in FIG. 6, a data refresh control operation performed on page 0 (the word line closest to the source line SL in the NAND string) corresponding to WL0 will be taken as an example.

3. Control Operation (Step ST0)

When the power supply voltage is input, an external controller (not shown) or the like inputs the block address of a block as a target of data retention check and an operation execution command.

(Step ST1)

Subsequently, on the NAND flash memory side, data is read out from page 0 (the word line closest to the source line SL in the NAND string) corresponding to the word line WL0 at the input block address at the normal read voltage level $Vr0$. More specifically, parameters pertaining to the normal read voltage level $Vr0$ are loaded from the ROMFUSE block into the register circuit Reg under the control of the controller 17. After that, the readout data (first readout data) is transferred to the first data latch circuit DL1.

(Step ST2)

Figure 7:
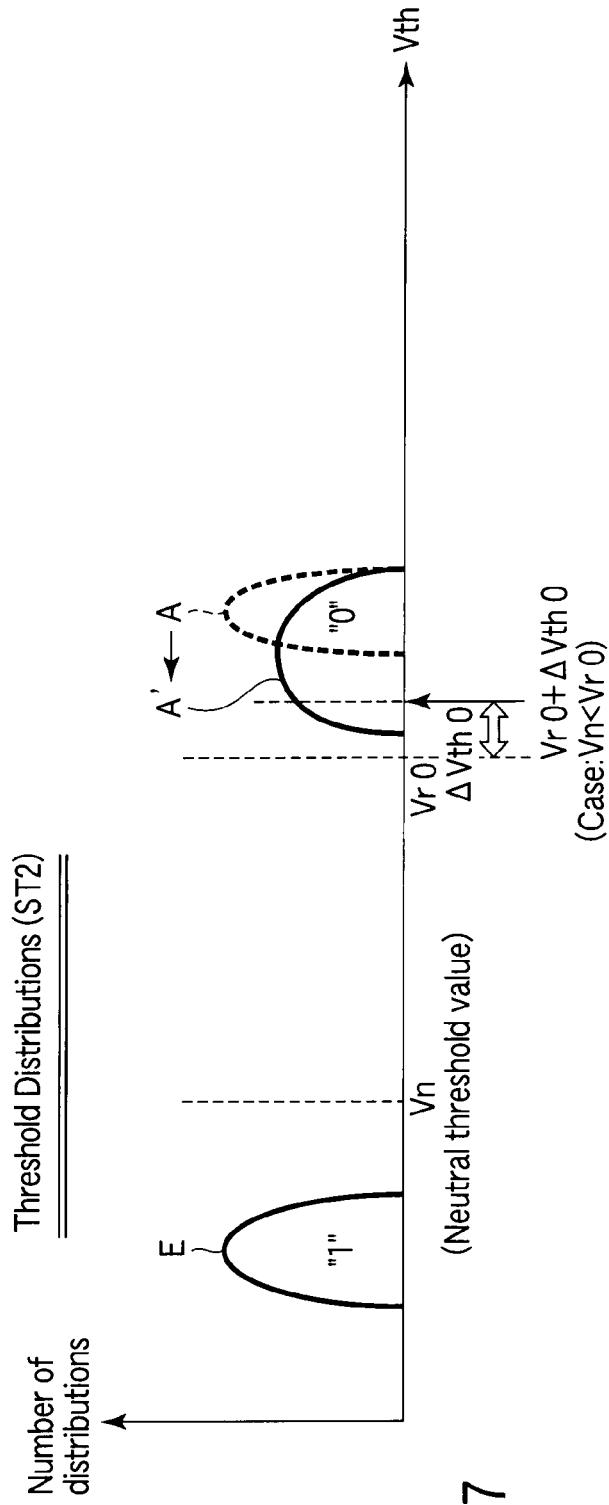
FIG. 7 is a graph showing threshold distributions for explaining a step (ST2) shown in FIG. 5.

Then, as shown in FIG. 7, data is read out at a voltage level $(Vr0+\Delta Vth0)$ slightly higher than the normal read voltage level $(Vr0)$ in step ST1 described above, and the readout data (second readout data) is transferred to the second data latch circuit DL2. This is a case in which the neutral threshold voltage $(Vn)$ is lower than the read voltage level $(Vr0)$, i.e., data retention has advanced as in this example. More specifically, parameters pertaining to the voltage level $(Vr0+\Delta Vth0)$ slightly higher than the normal read voltage level are loaded from the ROMFUSE block into the register circuit Reg under the control of the controller 17.

On the other hand, if the neutral threshold voltage $(Vn)$ is higher than the read voltage level $(Vr0)$ (data retention has not advanced much) in step ST2, data is read out by a voltage level $(Vr0-\Delta Vth0)$ lower than the normal read voltage level $(Vr0)$. When the cell threshold value is lower than the voltage level $(Vr0-\Delta Vth0)$ lower than the normal read voltage level owing to data retention as in this case, inverted data obtained by inverting the readout data is transferred to the second data latch circuit DL2.

(Step ST3)

The arithmetic unit CB calculates the exclusive OR XOR of the stored data (first readout data) of the first data latch circuit DL1 and the stored data (second readout data) of the second data latch circuit DL2, and transfers the calculation result to the third data latch circuit DL3. The data of the first and second data latch circuits are equal (DL1=DL2) when the calculation result data stored in the third data latch circuit DL3 is data "1", and different (DL1≠DL2) when the calculation result data stored in the third data latch circuit DL3 is data "0".

(Step ST4)

The counter circuit BS controlled by the controller 17 counts the number of data "0" (the number of differences between the first and second readout data) (N), of the calculation result data stored in the third data latch circuit DL3.
(Step ST5)

The controller 17 compares the number of data "0" (the number of differences between the first and second readout data) counted in step ST4 described above with, e.g., a parameter pertaining to the reference number (the number of allowable defects) (M) stored in the ROMFUSE block beforehand.

If the number (N) of data "0" is equal to or larger than the reference number (M) (N≧M) (FAIL), this determination result is held in the register Reg of the controller 17, and the process advances to step ST6.

On the other hand, if the number (N) of data "0" is smaller than the reference number (M) (N<M) (PASS), this determination result is held in the register Reg of the controller 17, and the operation is terminated (End).
(Step ST6)

When a predetermined command is input from the external memory controller (not shown) after that, the PASS/FAIL data obtained in step ST5 described above is output under the control of the controller 17.

More specifically, as shown in FIG. 8, if the number (N) of data "0" is equal to or larger than the reference number (M) (N≧M) (FAIL), "flag information (one-bit data) 37-1" indicating the approach of data destruction is added to a redundancy area 34-1 of the page as a unit memory area, and output from the NAND flash memory to the external memory controller.

The external memory controller checks the above-mentioned "flag information 37-1", and inputs corresponding redundancy information (e.g., an address or data) to the NAND flash memory.

Based on the redundancy information input from the external memory controller, the controller 17 stores the redundancy information (e.g., the address or data) in the ROMFUSE block (BLOCK 1) in the ROMFUSE array area 11-2.

Then, the controller 17 performs control so as to execute so-called data migration (replication) by which the redundancy information is read out from the ROMFUSE block (BLOCK 1) and copied to another page (block copy), and terminates the data refresh control operation on page 0 of this example.

After that, the data read check operation pertaining to the data retention operation in steps ST1 to ST6 described above is similarly automatically performed on page 1, page 2, . . . , page n in order. In this example as described above, the data read check is automatically executed in order from page 0. This is so because data write of the NAND flash memory of this embodiment is performed from page 0 described above. Also, the retention of data of page 0 has advanced most in many cases because of this write sequence.

Accordingly, the parameters to be stored in this ROMFUSE block can be set to meet the following relationships so as to decrease in the order of page 0, page 1, . . . , page n.

Normal read voltage level: Vr0 (page 0)≧Vr0 (page 1)≧, . . . , ≧Vr0 (page n)

Shift value from normal read level: ΔVth0 (page 0)≧ΔVth0 (page 1)≧, . . . , ≧ΔVth0 (page n)

Number of allowable defects: M (page 0)≧M (page 1)≧, . . . , ≧M (page n)

In the data refresh control operation according to this example as explained above, even when data has deteriorated due to data retention, redundancy of the data can be performed before data destruction by outputting information indicating the imminency of data destruction as the flag information (one-bit data) 37-1 to an external apparatus. Consequently, data destruction by data retention can be prevented.

Note that in this embodiment, the data read check operation performed on all the pages (page 0, page 1, . . . , page n) in a block is explained as an example. However, the present invention not limited to this. For example, it is also possible to perform the data read check operation not on all the pages but on only a page (page 0) in which data retention has advanced most in a block. This is advantageous in shortening the check operation time. Furthermore, since the erase unit is a block in a NAND flash memory, data moving write is also performed for each block. When applied to a NAND flash memory, therefore, the present invention is more advantageous in shortening the processing time.

4. Effect

The semiconductor memory device and the control operation of the same according to this embodiment achieves at least the effect of item (1) below.

(1) Data destruction by deterioration caused by data retention is suppressed.

As described above, the semiconductor memory device according to this embodiment includes at least the memory cell array 11, first data latch circuit DL1, second data latch circuit DL2, arithmetic unit CB, counter circuit BS, and controller 17. The memory cell array 11 includes the plurality of memory cells MT arranged in a matrix at the intersections of the plurality of word lines and the plurality of bit lines. The first data latch circuit DL1 latches the first readout data read out from a memory cell by using the parameters of the actual read level (Vr0). The second data latch circuit DL2 latches the second readout data read out from a memory cell by using the parameters of the level (Vr0+ΔVth0) shifted to be higher than the actual read level. The arithmetic unit CB calculates the exclusive OR (XOR) of the first and second readout data. The counter circuit BS counts the number of data "0" (the number of differences between the first and second readout data) (N) in the calculation result of the arithmetic unit. The controller 17 compares the number (N) with the reference number (M), and performs control to output the flag information 37-1 outside if N≧M.

In the above configuration, therefore, before data is destroyed by data retention, information (the flag information (one-bit data) 37-1) indicating the imminency of data destruction can be output outside (to, e.g., a memory controller (not shown)) from the NAND flash memory. In other words, the semiconductor memory device has the function of outputting status data (the flag information 37-1) indicating that the threshold voltage of a written cell has exceeded a predetermined fluctuation amount owing to data retention.

Accordingly, data can be moved to another block (by data migration) before the data is destroyed by data retention. This suppresses data destruction by deterioration caused by data retention.

In addition, it is unnecessary to form any additional circuit occupying a large area in order to execute the data refresh control operation according to this embodiment. This is advantageous in downsizing the device and reducing the fabrication cost.

Second Embodiment

Example of Multilevel Memory Cell (MLC)

A semiconductor memory device and a control method of the same according to the second embodiment will be explained below with reference to FIGS. 9 to 11. This embodiment is directed to an example in which the present invention is applied to a multilevel memory cell (MLC: Multi Level Cell) capable of storing data having a plurality of bits in one memory cell. In the following explanation, a repetitive explanation of the same portions as in the first embodiment will be omitted.

Configuration Example

First, an example of the configuration of the semiconductor memory device according to the second embodiment will be explained with reference to FIG. 9.

Example of Threshold Distributions (MLC)

Figure 9:
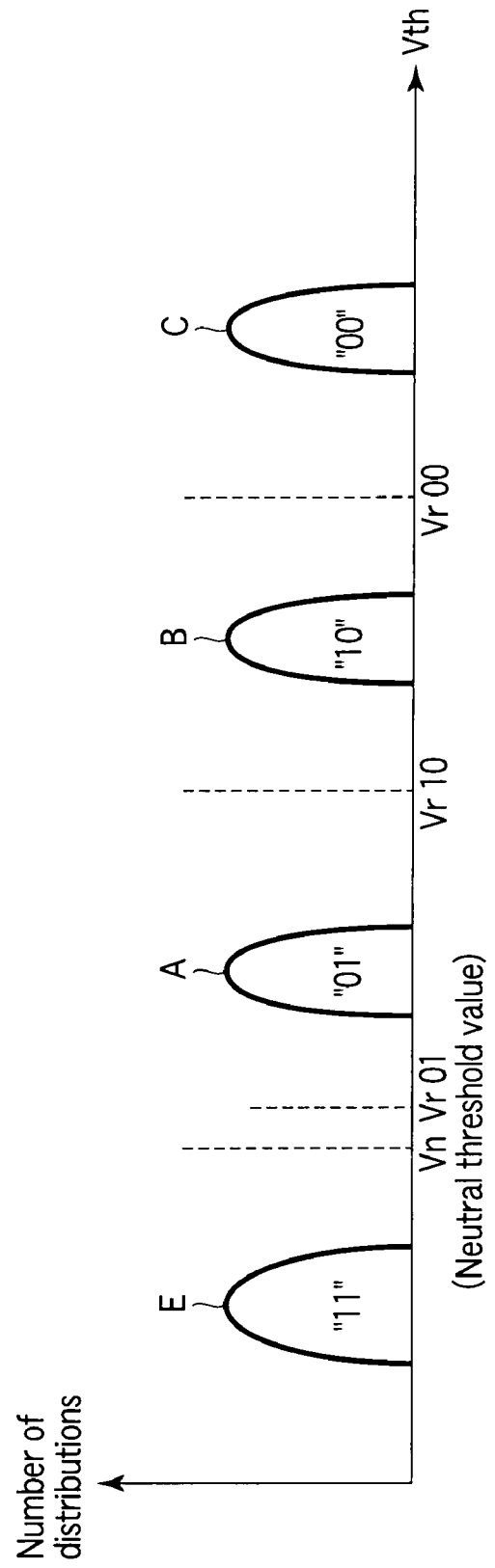
FIG. 9 is a graph showing the threshold distributions (multilevel) of a semiconductor memory device according to the second embodiment.

As shown in FIG. 9, the semiconductor memory device according to this embodiment differs from the above-described first embodiment in that the device includes a multilevel memory cell capable of storing data having a plurality of bits (in this example, quaternary data) in one memory cell MC.

As shown in FIG. 9, four threshold distributions, i.e., states "11(E)", "01(A)", "10(B)", and "00(C)" exist. A read voltage Vr01 for reading out the state "01(A)" is set between a neutral threshold voltage Vn and the state "01(A)". A read voltage Vr10 for reading out the state "10(B)" is set between the states "01(A)" and "10(B)". A read voltage Vr00 for reading out the state "00(C)" is set between the states "10(B)" and "00(C)".

<Data Refresh Control Operation>

A data refresh control operation according to this embodiment will be explained below with reference to FIGS. 10 and 11. In this explanation, a repetitive explanation of the same portions as in the first embodiment will be omitted.

First, the same control as in steps ST0 and ST1 described previously is performed.

(Step ST2: Threshold Distributions in Data Retention)

Subsequently, in this embodiment as shown in FIG. 10, data is read out at a voltage level (Vr01+ΔVth01, Vr10+ΔVth10, or Vr00+ΔVth00) slightly higher than the normal read voltage level (Vr01, Vr10, or Vr00) in step ST1 for each threshold distribution, and the readout data is transferred to a second data latch circuit DL2. This is a case in which data retention has advanced as described earlier.

In the multilevel semiconductor memory device according to this embodiment as described above, several memory cell threshold distributions exist. Note that the data retention amounts of these threshold distributions are not equal. This is so because the data retention amount increases as the threshold value deviates from the neutral threshold value (Vn). In other words, in this embodiment, the data retention amount sequentially decreases from the state "A" to a state "A'", from the state "B" to a state "B'", and from the state "C" to a state "C'" (data retention amounts: DRA<DRB<DRC).

In this embodiment, therefore, parameters (shift voltage values: ΔVth01>Vr1>ΔVth10>ΔVth00) to be stored in a memory cell MT in a ROMFUSE block are set to decrease in the order of the states "A", "B", and "C".

As described above, the data retention amount increases as the threshold value deviates from the neutral threshold value (Vn). As effective control, therefore, the voltage level shifted to be higher than the normal read voltage level for performing the data retention check in step ST2 may also be used for, e.g., the highest threshold distribution ("00(C)") for which the influence of data retention is maximum.

More specifically, control may also be performed in step ST2 so as to read out data at the voltage level (Vr00+ΔVth00) slightly higher than the normal read voltage level with respect to the highest threshold distribution ("00(C)") for which the influence of data retention is maximum, and transfer the readout data to the second data latch circuit DL2. However, the distance between the threshold distributions is set in accordance with the generation. Therefore, the parameter (Vr00+ΔVth00) to be stored in the memory cell MT in the ROMFUSE block is made variable so that data read can be performed with respect to a threshold distribution (in this embodiment, "00(C)") for which the influence of data retention is most severe.

Subsequently, the same control as in steps ST3 and ST5 described previously is performed.

Flag Information (MLC)

When a predetermined command is input from an external memory controller (not shown) in step ST6 described earlier, PASS/FAIL data obtained in step ST5 is output under the control of a controller 17.

Figure 11:
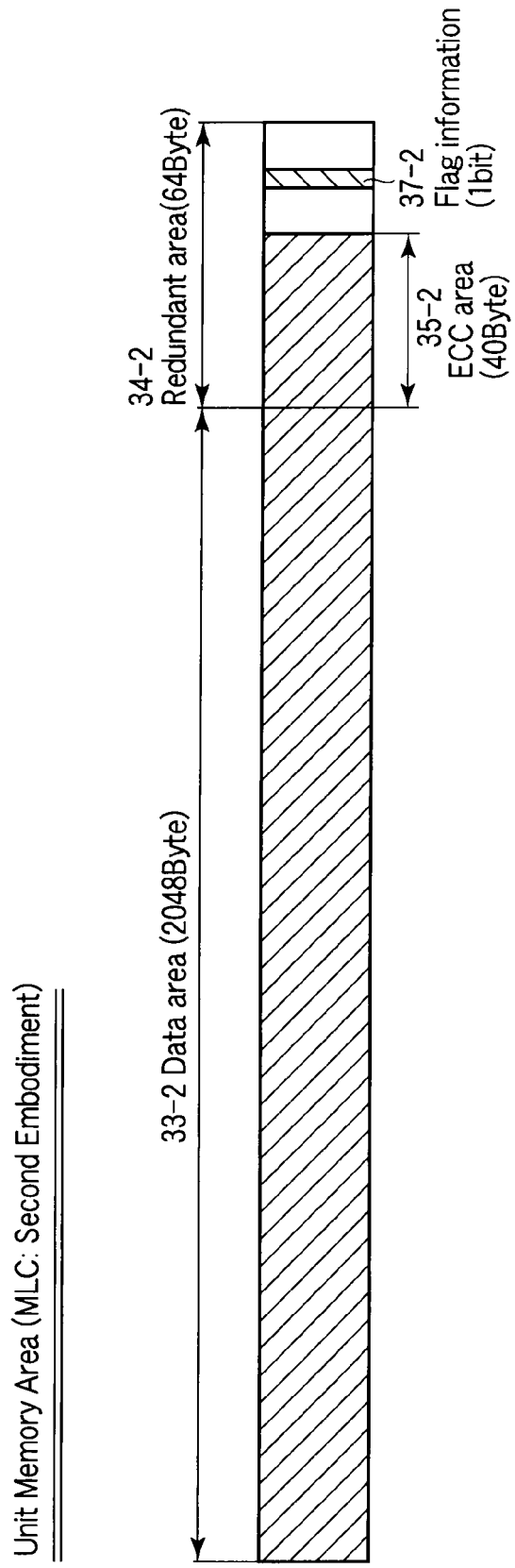
FIG. 11 is a view showing a unit memory area (page) of the semiconductor memory device according to the second embodiment.

More specifically, as shown in FIG. 11, if the number of data "0" (the number of differences between the first and second readout data) (N) is equal to or larger than the reference number (M) (N≧M) (FAIL) in the state "01(A)", "10 (B)", or "00(C)", "flag information (one-bit data) 37-2" indicating the imminency of data destruction is added to a redundancy area 34-2 of the page as a unit memory area, and output from the NAND flash memory to the external memory controller.

The external memory controller checks "the flag information 37-2", and inputs corresponding redundancy information (e.g., an address or data) to the NAND flash memory.

Based on the redundancy information input from the external memory controller, the controller 17 stores the redundancy information (e.g., the address or data) in the ROMFUSE block (BLOCK 1) in a ROMFUSE array area 11-2.

Then, the controller 17 performs control so as to execute so-called data migration by which the redundancy information is read out from the ROMFUSE block (BLOCK 1) and copied to another page (block copy), and terminates the data refresh control operation of this embodiment on selected page 0.

After that, the data read check operation pertaining to the data retention operation in steps ST1 to ST6 described above is similarly automatically performed on page 1, page 2, . . . , page n in order.

<Effects>

As described above, the semiconductor memory device and the data refresh control operation of the same according to the second embodiment achieve at least the same effect as that of item (1) described previously. In addition, this embodiment achieves at least the effect of item (2) below.

(2) The effect of suppressing data destruction by deterioration caused by data retention is particularly high when the capacity is increased by the multilevel write method.

As described above, the semiconductor memory device and the data refresh control method of the same according to this embodiment can be applied to a multilevel memory cell (MLC) capable of storing data having a plurality of bits in one memory cell. Accordingly, the effect of suppressing data destruction by deterioration caused by data retention is especially high when the capacity is increased by the multilevel write method.

In addition, the present invention is not limited to this embodiment, and similarly applicable to, e.g., a memory including both the binary area (SLC) according to the first embodiment and the multilevel area (MLC) according to this embodiment in a single memory cell array 11. In this case, the binary area and multilevel area have different reliability specifications and different threshold distributions of the memory cell MT. Therefore, the shift value ΔVth from the normal read level and the allowable number of defects (reference number) M for the binary area and those parameters for the multilevel area can independently be stored in the ROMFUSE block (BLOCK 1) and set.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array including a plurality of memory cells arranged at intersections of a plurality of word lines and a plurality of bit lines;
a first data latch circuit which latches first readout data read out from the memory cell by using a parameter of an actual read level;
a second data latch circuit which latches second readout data read out from the memory cell by using a parameter of a level shifted to be higher than the actual read level;
an arithmetic circuit which performs an arithmetic operation on the first readout data and the second readout data;
a counter circuit which counts the number (N) of differences between the first readout data and the second readout data in an operation result from the arithmetic circuit; and
a controller which compares the number (N) with a reference number (M), and performs control to output flag information outside if $N \geq M$.

2. The device of claim 1, further comprising a third data latch circuit which latches the operation result from the arithmetic circuit.

3. The device of claim 1, wherein
the memory cell comprises a multilevel memory cell configured to store data having a plurality of bits in one memory cell, and
the parameter of the level shifted to be higher than the actual read level is used for a highest threshold distribution of a plurality of threshold distributions corresponding to the data having a plurality of bits.

4. The device of claim 1, wherein the memory cell comprises a binary memory cell configured to store one-bit data in one memory cell.

5. The device of claim 1, wherein the parameter of the actual read level, the parameter of the level shifted to be higher than the actual read level, and the reference number (M) are stored in the memory cell array and variable.

6. The device of claim 5, wherein
the memory cell array comprises a binary area (SLC) and a multilevel area (MLC), and
the parameter of the actual read level, the parameter of the level shifted to be higher than the actual read level, and the reference number (M) are stored in a ROMFUSE block of the memory cell array, and independently variable between the binary area and the multilevel area.

7. The device of claim 1, wherein after outputting the flag information outside, the controller performs data write by which data corresponding to redundancy information is copied to another memory cell.

8. The device of claim 7, wherein the controller stores the redundancy information in a ROMFUSE array area of the memory cell array.

9. The device of claim 1, wherein the arithmetic operation performed by the arithmetic circuit is exclusive OR of the first readout data and the second readout data.

10. The device of claim 1, wherein the flag information is added to a redundancy area in a unit memory area of the memory cell array.

11. A semiconductor memory device control method comprising:
acquiring first readout data by reading out the data from a memory cell at an actual read level;
acquiring second readout data by reading out the data from the memory cell at a level shifted to be higher than the actual read level;
performing an arithmetic operation on the first readout data and the second readout data;
counting the number (N) of differences between the first readout data and the second readout data in an operation result; and
comparing the number (N) with a reference number (M), and outputting flag information outside if $N \geq M$.

12. The method of claim 11, further comprising, after outputting the flag information outside, performing a write operation by which data corresponding to redundancy information is copied to another memory cell.

13. The method of claim 11, further comprising, before acquiring the first readout data, acquiring a block address of a block as a target of data retention check and a command from outside.

14. The method of claim 11, further comprising latching the operation result.

15. The method of claim 11, wherein
the memory cell comprises a multilevel memory cell configured to store data having a plurality of bits in one memory cell, and
the parameter of the level shifted to be higher than the actual read level is used for a highest threshold distribution of a plurality of threshold distributions corresponding to the data having a plurality of bits.

16. The method of claim 11, wherein the memory cell comprises a binary memory cell configured to store one-bit data in one memory cell.

17. The method of claim 11, wherein the parameter of the actual read level, the parameter of the level shifted to be higher than the actual read level, and the reference number (M) are stored in the memory cell array and variable.

18. The method of claim 11, wherein
the memory cell array comprises a binary area (SLC) and a multilevel area (MLC), and
the parameter of the actual read level, the parameter of the level shifted to be higher than the actual read level, and the reference number (M) are stored in a ROMFUSE block of the memory cell array, and independently variable between the binary area and the multilevel area.

19. The method of claim 11, wherein the arithmetic operation is exclusive OR of the first readout data and the second readout data.

* * * * *